United States Patent [19]
Lieux et al.

[11] Patent Number: 5,159,274
[45] Date of Patent: Oct. 27, 1992

[54] DEVICE AND METHODS FOR MEASURING THE QUALITY OF CONTACT BETWEEN TWO ELECTRICAL CONDUCTORS

[75] Inventors: George Lieux, Martigues; Jean Aubert, Saint-Mitre-Les Remparts, both of France

[73] Assignee: Atochem, Puteaux, France

[21] Appl. No.: 659,085

[22] Filed: Feb. 22, 1991

[30] Foreign Application Priority Data

Feb. 27, 1990 [FR] France .................. 90 02419

[51] Int. Cl.⁵ ............................... G01R 31/04
[52] U.S. Cl. ........................... 324/538; 324/537; 324/158 P
[58] Field of Search .............. 324/538, 697, 713, 715, 324/718, 724, 149, 502, 402, 158 P, 537, 522, 555, 72.5

[56] References Cited

U.S. PATENT DOCUMENTS

| | | |
|---|---|---|
| 2,954,521 | 9/1960 | McKee . |
| 3,996,514 | 12/1976 | Brown et al. . |
| 4,829,235 | 5/1989 | Robinson et al. ............... 324/502 X |
| 4,888,546 | 12/1989 | Berry et al. .................... 324/718 X |

FOREIGN PATENT DOCUMENTS

2352430 9/1975 Fed. Rep. of Germany .

Primary Examiner—Jack B. Harvey
Attorney, Agent, or Firm—Burns, Doane, Swecker & Mathis

[57] ABSTRACT

A device for measuring the quality of contact between two electrical conductors of an electrical circuit comprises a frame on which are mounted two electrically conductive elements and two electrically conductive pins. The frame is adapted to be inserted onto the electrical conductors, whereupon mechanical actuators displace the elements and pins such that each conductor is contacted by one of the elements and one of the pins to create an electric circuit. The elements are connected to a current generator to cause a current to flow within the circuit. A volt meter is provided to measure the drop in potential between the two pins. Knowledge of the resistance of each conductor enables the drop in potential to be used to measure the quality of the electrical contact between the conductors. The device is particularly useful to determine the quality of contact between conductors whose connections are not readily visible or accessible such as in an electrolysis apparatus in which an anode is immersed in a bath.

8 Claims, 2 Drawing Sheets

DEVICE AND METHODS FOR MEASURING THE QUALITY OF CONTACT BETWEEN TWO ELECTRICAL CONDUCTORS

BACKGROUND OF THE INVENTION

1. Field of the Invention

The present invention relates to a device and methods for measuring the quality of contact between two electrical conductors.

The invention is useful for quickly measuring the quality of electrical contact between assemblies of different electrically conductive metals, especially in certain chemoelectrical reactions where the electrical connections in question are not readily visible or otherwise accessible.

2. Description of the Prior Art

For example, the industrial production of chlorine and of sodium bicarbonate is described in KIRK OTHMER (ENCYCLOPEDIA OF CHEMICAL TECHNOLOGY, Vol. 1, pages 806 et seq., 3rd edition, John Wiley). In the mercury process, the anodes comprise titanium wire grids which can reach one meter by three meters and which are reinforced by rods and crosspieces made of titanium soldered onto these grids in order to keep them perfectly planar. Screwed onto these crosspieces are copper rods which ensure the electrical junction with the rest of the electrolysis electrical circuit and also permit these anodes to be held in the sodium chloride solution several millimeters above the mercury.

If the quality of contact between the copper rod and the titanium crosspiece is not good, heating due to the Joule effect occurs which may even cause the copper-titanium junction to rupture mechanically as a result of fusion of the metals. This is why it is very important to be certain of the quality of contact between the copper and titanium before mounting the anodes in the electrolysis cells when the electrolysis cell is operative.

During an electrolysis operation, the junction between the copper rods and the titanium crosspieces is submerged in the sodium chloride solution; in addition, above this solution there is the chlorine which has formed on the surface of the titanium anodes. It is thus impossible to gain access to the copper-titanium junction to inspect the quality thereof.

SUMMARY OF THE INVENTION

The applicants have provided a device and methods which permits the quality of contact between the two inaccessible electrically conductive elements to be tested. Moreover, such testing is performed using a current strength similar to that which is going to pass through the contact during real functioning.

The measuring device comprises a frame formed of electrically insulating material and adapted to be placed in a measuring position relative to a pair of electrical conductors. Two electrically conductive elements, e.g., clips, are mounted on the frame and are adapted to be electrically connected to a current generator. A first holding mechanism is provided for holding the elements in electrical contact with respective ones of the conductors when the frame is in its measuring position, in order to create a current flow between the conductors when the elements are connected to the current generator. Two electrically conductive pins are mounted on the frame. A second holding mechanism is provided for holding the pins in electrical contact with respective ones of the conductors at locations in the electrical circuit disposed between the two elements. An instrument is provided for measuring the difference in potential between the pins. The device permits the voltage drop to be measured between two points of an electrical circuit comprising the two conductors and, more particularly, the voltage drop caused by their contacting. Since the resistance of each conductor is known, the resistance of their contact is deduced from the voltage drop.

The two conductors can be identical or different. The conductive clips have the function of bringing the current to each conductor. The fixing means can be electromagnetic systems, actuators or any other system permitting the clip to be fixed to the conductors. Since each clip is connected to the terminals of a current generator, a circuit between the conductors and generator is established. The real operation of the two conductors and at real current strength can thus be simulated, and the contact resistance of the conductors can be measured. The two pins come into abutment against each conductor, either by means of fluid actuators or by electromagnetic devices or any equivalent means. The device can be used to measure the resistance of all assemblies such as electrodes (cathodes or anodes). The device can be used to measure a plurality of contact resistances in series. For example, for the copper/titanium assemblies of the anodes which are useful in the mercury electrolysis process, it is simpler to measure them in groups of two in series.

If a fault is discovered, it is necessary to dismount two contacts and remake them but this is largely compensated for by the speed and reliability of the measurements when applied to all the other assemblies.

According to one aspect of the device according to the invention, the clips are metallic, of essentially semicylindrical shape and are arranged so as to become fixed on two cylindrical conductors under the effect of an actuator. According to another aspect of the invention, the mount and the clips are arranged in such a way that they fit onto two parallel conductors. Advantageously, the pins fit against the conductors under the effect of an actuator.

BRIEF DESCRIPTION OF THE DRAWINGS

The objects and advantages of the invention will become apparent from the following detailed description of a preferred embodiment thereof in connection with the accompanying drawings, in which like numerals designate like elements, and in which.

DETAILED DESCRIPTION OF THE INVENTION

Figure 1:
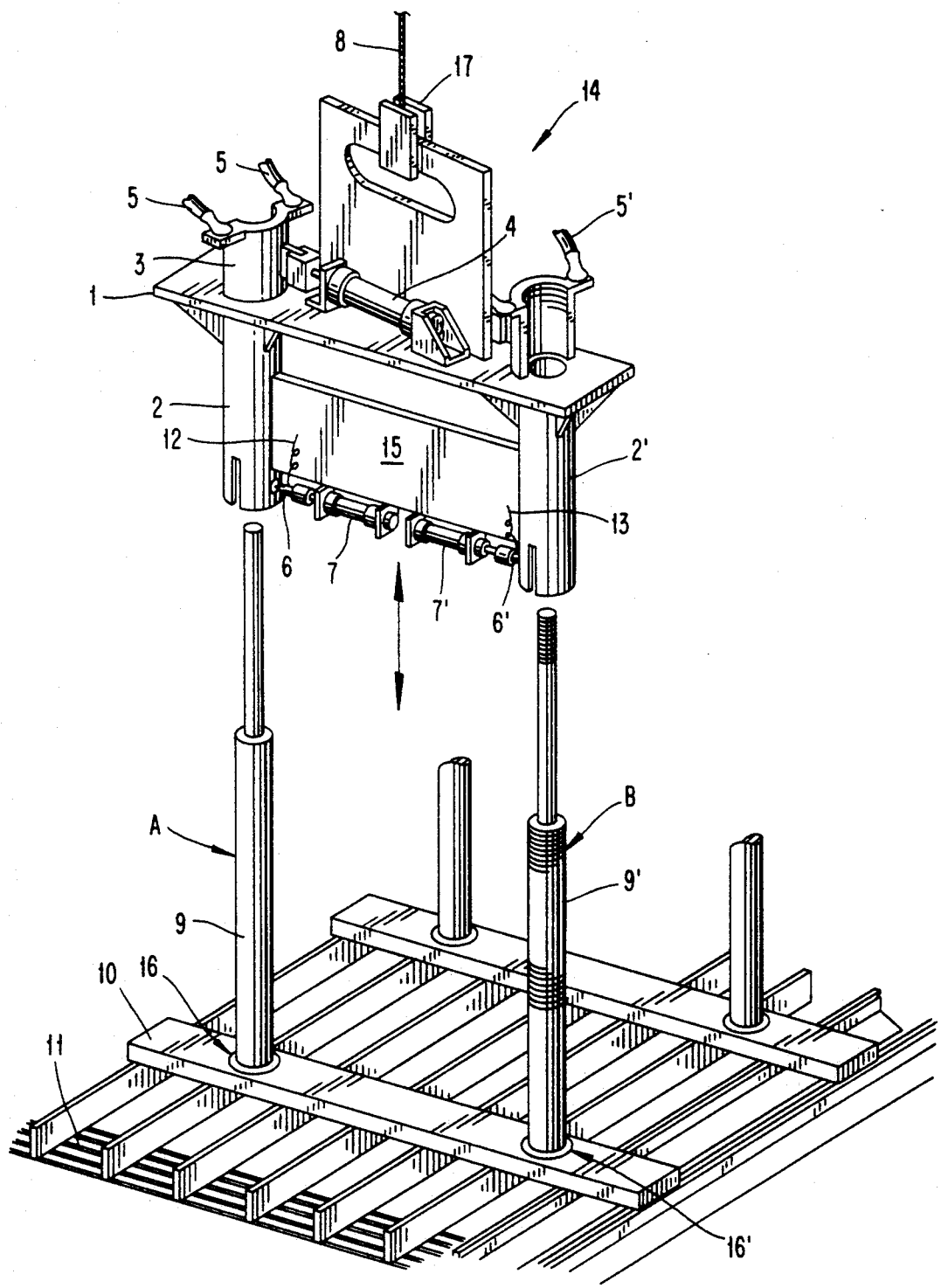
FIG. 1 is an exploded perspective view of a measuring device according to the present invention situated above a pair of electrical conductors.
Figure 2:
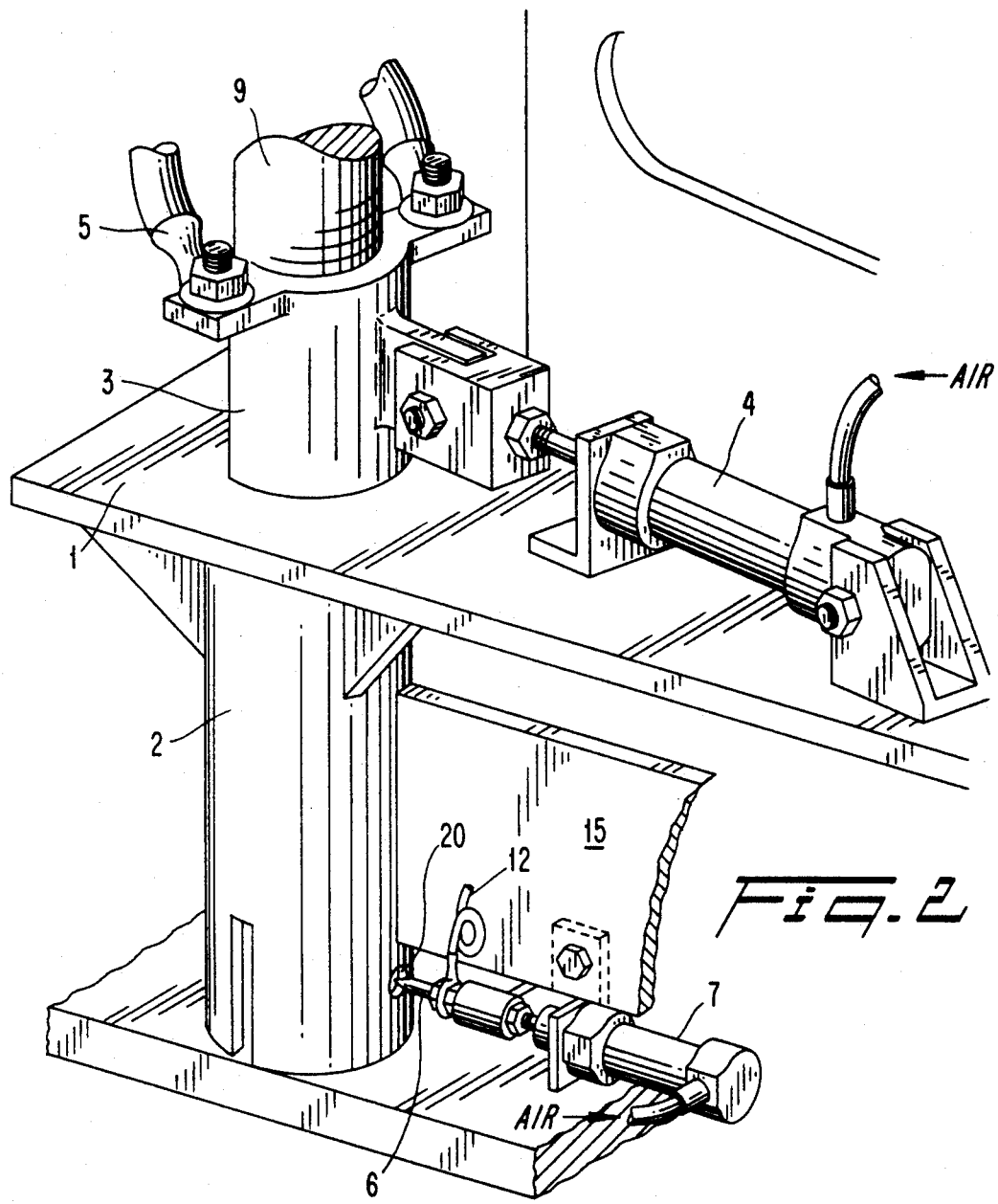
FIG. 2 is a fragmentary perspective view of the measuring device depicted in FIG. 1 after the device has been lowered onto the conductors, and after a clip element has been displaced into electrical connection with one of the conductors.

FIGS. 1 and 2 depict a preferred embodiment of a measuring device 14 according to the invention for measuring the circuit resistance between two cylindrical and parallel conductors A, B. To aid comprehension, the device is described in conjunction with its use for measuring a circuit composed of two conductors in the form of parallel cylindrical copper rods 9, 9' screwed into a titanium crosspiece 10 which carries a titanium wire 11. Those elements are part of an anode for an electrolysis process.

The measuring device 14 comprises a frame 1 made of electrically insulating material, for example plastic material, which serves as support for various electrically conductive elements of the measuring device 14.

This frame includes two hollow cylinders 2, 2' also made of electrically insulating material, which permit the apparatus to slide along the two cylindrical copper rods of the metallic anode, the anode being formed by the rods 9, 9', the titanium crosspieces 10, and the titanium wire grid 11.

Two electrically conductive elements in the form of metallic clips, 3, 3' made of copper, are attached to the frame 1 by two pneumatic actuators 4 which move the clips horizontally (only one actuator depicted). The clips are preferably semi-cylindrical in shape because they abut against the copper cylindrical rods 9, 9' of the anodes when moved theretoward by the actuators 4.

Figure 3:
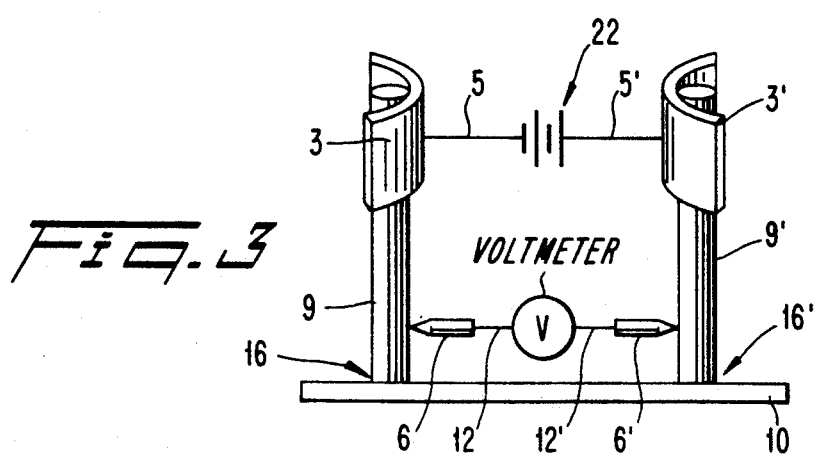
FIG. 3 is a schematic view of an electrical circuit created after the clip elements and a pair of electrically conductive pins have been moved into electrical contact with the two conductors.

Two electrical conductors 5, preferably made of copper, are connected to one of the poles of an electrical current generator 22 (FIG. 3), which may generate, for example, a direct current of several thousand amperes, with a potential difference of several volts. The other clip is connected to the other pole by a conductor 5'.

The frame 1 includes a plate 15. Two metallic pins 6, 6' are mounted on the frame 1 by means of a pair of pneumatic actuators 7, 7' which are mounted to the plate 15. Those actuators 7, 7' move the pins horizontally at locations below the clips 3, 3'. Each of the hollow cylinders 2, 2' is provided with a hole 20 aligned with the respective pin. Under the action of these actuators 7, 7', these contact with the electrical circuit immediately upstream and downstream, respectively, of the part of the circuit where it is desired to measure the drop in potential, e.g., at the locations 16, 16' where the copper rods 9, 9' are joined to the crosspiece 10.

A voltmeter 24 having a digital display with an accuracy of 0.1 mV is connected to the two metallic pins 6, 6' by wires, respectively.

The frame 1 can be suspended from a bracket (not shown) by a vertical displacement cable 8 mounted on a horizontal displacement slide 17. A high degree of maneuverability for the measuring device 14 is thus obtained when a large number of repetitive measurements are to be carried out on the metallic anodes.

As noted earlier, a particularly useful application of this deice 14 is for measuring the drop in electrical potential between the various metallic pieces comprising the anodes for the electrolysis of sodium chloride brine. The number of applications is not restricted to this one example, however.

The metallic anodes are composed of the pieces 10 of titanium joined together by soldering. The copper rods 9, 9' of cylindrical shape, are screwed to these titanium pieces 10. In order to improve the copper-titanium contact, an alloy with a low melting point (for example "Wood alloy", m.p.=60° C., consisting of 50% bismuth, 25% lead, 12.5% cadmium, 12.5% tin) is poured beforehand into the titanium internal, screw thread. Since the contact between the copper rods 9, 9' and the titanium piece 10 cannot be observed visually, because it is submerged in the Wood alloy, it is very advantageous to use the measuring device 14 to measure the quality of these electrical contacts.

For this purpose, the device 14 is fitted onto the copper rods 9, 9' of the anode by simply sliding the cylinders 2, 2' over the ends of the rods 9, 9'. The two semi-cylindrical metal clips, made of copper, are forced against the copper rods under the control of the two horizontally moving pneumatic actuators 4, 4' and the pins 6, 6' are inserted through the holes 20 by the actuators 7, 7' into electrical contact with the rods 9, 9'. The clips 3, 3' thus also serve to attach the device 14 to the rod conductors 9, 9'.

The two copper clips are connected electrically by wires 5, 5' to the direct current generator 22, causing a direct current (for example 2000 A at 4 volts) to pass through the circuit between the Cu rods and titanium pieces, the current being comparable in current density to that used during the electrolysis of NaCl brine.

When the electrical current flows through the metallic circuit thus formed, the two pins 6, 6' are placed in abutment with the copper rods at two chosen points located upstream and downstream, respectively, of the Cu-Ti contacts 16, 16'. The drop in potential between those chosen points is measured by simply reading the voltmeter connected to the pins 6, 6' by wires 12, 13. The measured value of the drop in voltage can be displayed on a digital screen. Due to previous calibration, it is easy to determine therefrom the quality of the Cu-Ti electrical contacts. Since the resistances of the conductors are known, the resistance of their electrical connection can be deduced from the measured voltage drop. The lower the measured value of voltage drop (approximately 5 to 10 mV in the case in question), the better the electrical contact between copper and titanium at connections 16, 16'.

Conversely, a voltage drop value higher than 20 mV permits an electrical contact of bad quality to be immediately detected which would require repair before a new test.

If a fault is discovered, the connections between the conductors 9, 9', 10 is remade.

The measuring device 14 according to the present invention permits a very rapid measurement of the drop in potential to be made by simply reading off the millivoltmeter; this permits the electrical current to be fed into the circuit only when measuring, i.e., for a very short period. Thus, any heating up of the electrical circuits is avoided; the consumption of electrical current is reduced; and a large number of measurements can be carried out in a short time.

Thanks to this measuring device, metallic anodes which have been tested with favorable results for good quality of the electrical contacts have a clearly increased life span and may remain in a perfectly operative state for several years with minimum consumption of current.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A device for measuring the electrical contact between two electrical conductors of an electrical circuit, comprising:
   a frame formed of electrically insulating material and including two hollow cylinders each defining an axis, said frame adapted to be placed in a measuring position in which the conductors are received in said cylinders,
   two electrically conductive elements mounted on said frame adjacent respective ones of said cylinders and adapted to be electrically connected to a current generator, said elements mounted for movement toward and away from respective ones of said axes in directions transversely thereof, each of said elements including a concavely curved surface facing a respective one of said axes,
   first holding means for moving said elements toward said respective axes and against respective ones of said conductors when said frame is in said measuring position, for securing said frame to said conductors and establishing a current flow between said conductors when said elements are connected to said current generator,
   two electrically conductive pins mounted on said frame adjacent respective ones of said cylinders for movement toward and away from respective ones of said axes in directions transversely thereof,
   second holding means for moving said pins toward said respective axes and into electrical contact with respective ones of said conductors when said frame is in said measuring position, said pins contacting said conductors at locations in said electrical circuit disposed between said two elements, and
   means for measuring the difference in potential between said pins.

2. A device according to claim 1, wherein said elements are moved toward said respective axes in generally opposite directions.

3. A device according to claim 2, wherein said pins are moved toward said respective axes in generally opposite directions.

4. A device according to claim 1, wherein said axes are mutually parallel.

5. A device according to claim 1, wherein said first holding means comprise actuators mounted on said frame and arranged to displace said elements toward the conductors.

6. A device according to claim 1, wherein said pins are arranged to pass through openings in said cylinders.

7. A method for measuring the quality of electrical contact between first and second conductors of an electrical circuit, comprising the steps of:
   positioning a frame in a measuring position relative to first and second conductors by sliding first and second hollow cylinders of said frame over said first and second conductors, respectively,
   displacing first and second frame elements carried by said frame toward and against respective ones of said conductors in generally opposite directions extending transversely of first and second axes defined by said cylinders, respectively, whereby said first and second elements secure said frame to said first and second conductors,
   connecting said first and second elements to a current generator to pass an electric current through said first and second conductors,
   displacing first and second pins carried by said frame into electrical contact with said first and second conductors, respectively, in directions extending transversely of said first and second axes at locations in said circuit disposed between said first and second elements, and
   measuring the different in potential between said pins.

8. A method according to claim 7, wherein said electric current which is passed through said first and second conductors is about 2000 Amps.

* * * * *